(12) United States Patent
Park (10) Patent No.: US 7,636,000 B2
(45) Date of Patent: Dec. 22, 2009

(54) PHASE LOCKED LOOP WITHOUT A CHARGE PUMP AND INTEGRATED CIRCUIT HAVING THE SAME

(75) Inventor: Jae-Jin Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 11/975,158

(22) Filed: Oct. 18, 2007

(65) Prior Publication Data

US 2008/0100352 A1 May 1, 2008

(30) Foreign Application Priority Data

Oct. 27, 2006 (KR) .................. 10-2006-0104830

(51) Int. Cl.
*H03L 7/06* (2006.01)
(52) U.S. Cl. .................. 327/157; 327/148; 331/17; 375/374
(58) Field of Classification Search .................. 327/148, 327/157; 331/17; 375/374
See application file for complete search history.

(56) References Cited

U.S. PATENT DOCUMENTS

| | | | |
|---|---|---|---|
| 6,356,157 B1 * | 3/2002 | Kawamura .................. | 331/11 |
| 6,727,735 B2 | 4/2004 | Park | |
| 6,909,312 B2 * | 6/2005 | Mitsumoto .................. | 327/141 |
| 7,088,797 B2 * | 8/2006 | Momtaz et al. ............. | 375/376 |

FOREIGN PATENT DOCUMENTS

| | | |
|---|---|---|
| JP | 11-355134 | 12/1999 |
| KR | 2000-0070300 | 11/2000 |
| KR | 10-0422578 | 3/2004 |

OTHER PUBLICATIONS

Sun, Lizhong, et al., A 1.0V GHz Range 0.13μm CMOS Frequesncy Synthesizer, IEEE Custom Integrated Circuits Conference, 2001, pp. 327-330, IEEE.
Gu, Richard, et al., A 6.25GHz 1V LC-PLL in 0.13μm CMOS, ISSCC 2006/Session 32, 2006, IEEE International Solid-State Circuits Conference.

* cited by examiner

*Primary Examiner*—Lincoln Donovan
*Assistant Examiner*—Patrick O'Neill
(74) *Attorney, Agent, or Firm*—Mills & Onello, LLP

(57) ABSTRACT

A phase locked loop includes a phase-frequency detector and a loop filter. The phase-frequency detector compares phases of an input signal and a feedback signal to generate first and second control signals. The loop filter includes a pull-up resistor, a pull-down resistor and a capacitance unit. The loop filter receives a first reference voltage to charge the capacitance unit through a path formed by the pull-up resistor to the capacitance unit, receives a second reference voltage to discharge the capacitance unit through a path formed by the pull-down resistor to the capacitance unit and outputs a control voltage generated based on a charge amount of the charged capacitance unit. Therefore, the phase locked loop can operate at a relatively low voltage and can operate based on a control voltage with a wide input range.

14 Claims, 6 Drawing Sheets

PHASE LOCKED LOOP WITHOUT A CHARGE PUMP AND INTEGRATED CIRCUIT HAVING THE SAME

CROSS-REFERENCE TO RELATED APPLICATIONS

This application claims priority under 35 USC § 119 to Korean Patent Application No. 10-2006-0104830 filed on Oct. 27, 2006 in the Korean Intellectual. Property Office (KIPO), the disclosure of which is incorporated herein in its entirety by reference.

BACKGROUND OF THE INVENTION

1. Field of the Invention

The present invention relates to a phase locked loop (PLL), and more particularly to a PLL without a charge pump and an integrated circuit having the PLL.

2. Description of the Related Art

Various electronic devices include a PLL for stabilizing a generated signal having a desired frequency.

Generally, a PLL can include a phase-frequency detector, a charge pump, a loop filter, a voltage-controlled oscillator (VCO) and a divider. The PLL detects a phase/frequency difference between an input signal (FIN) and a divided signal (FOUT/M) and controls a phase/frequency of an output signal (FOUT) based on a result of the detected phase/frequency difference.

The VCO performs based on a control voltage outputted from the loop filter. For example, when the control voltage is relatively low, the VCO can output an output signal (FOUT) having a relatively low frequency, and when the control voltage is relatively high, the VCO can output an output signal (FOUT) having a relatively high frequency.

Figure 1:
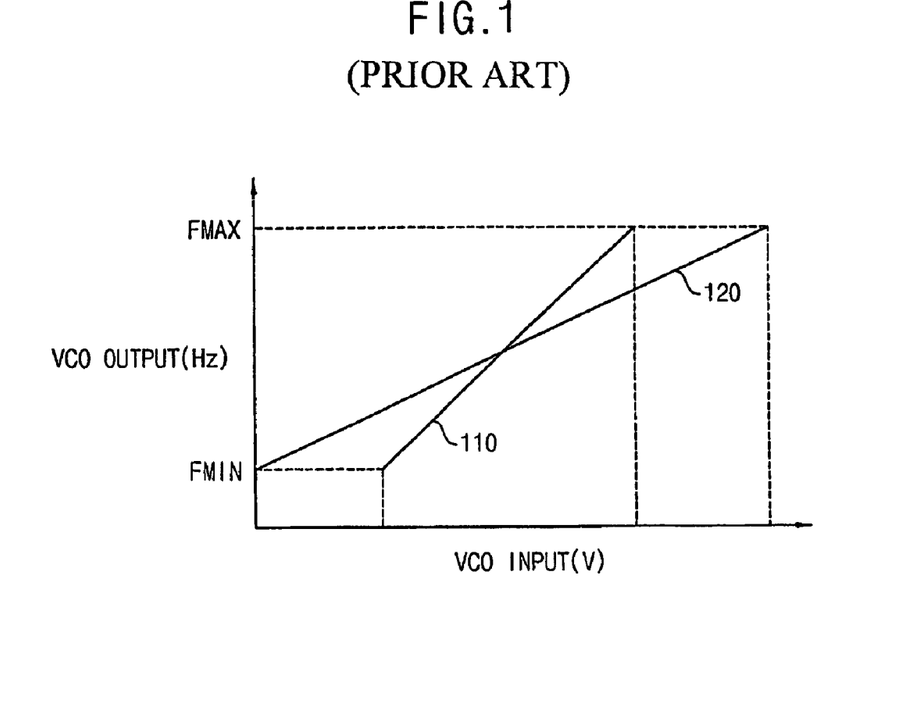
FIG. 1 is a graph illustrating relations between a frequency of an output signal and a control voltage.

FIG. 1 is a graph illustrating relations between a frequency of an output signal and a control voltage.

Referring to FIG. 1, a slope of a first line 110 is steeper than a slope of a second line 120. Thus, a frequency change of an output signal (FOUT) according to the control voltage in the first line 110 is greater than a frequency change of an output signal (FOUT) according to the control voltage in the second line 120. As such, a VCO need to operate based on a control voltage with a wide input range so as to obtain an output signal (FOUT) having a stable frequency.

A conventional PLL is disclosed in "L. Sun and D. Nelson, A 1.0V GHz Range 0.13 µm CMOS Frequency Synthesizer, IEEE Custom Integrated Circuits Conference, pp. 327-330, May 2001" and "R. Gu, et al., A 6.25 GHz 1V LC-PLL in 0.13 µm CMOS, ISSCC Digest of Technical Papers, pp. 594-595, February 2006", in which a charge pump is improved to obtain a control voltage with a wide input range so as to generate an output signal (FOUT) having a stable frequency. However, the charge pump in the conventional phase loop is complex, and the charge pump is required to be performed by a low voltage in a submicron process.

SUMMARY OF THE INVENTION

In accordance with the present invention a phase locked loop can be provided that is capable of operating at a relatively low voltage and operating based on a control voltage with a wide input range.

Also in accordance with the present invention an integrated circuit can be included having the phase locked loop.

Also in accordance with the present invention a method can be provided for locking a phase of a signal at a relatively low voltage and based on a control voltage with a wide input range.

In accordance with an aspect of the present invention, a phase locked loop includes a phase-frequency detector and a loop filter. The phase-frequency detector is configured to compare phases of an input signal and a feedback signal to generate first and second control signals. The loop filter includes a pull-up resistor, a pull-down resistor, and a capacitance unit. The capacitance unit is coupled to a coupling node between the pull-up resistor and the pull-down resistor. The loop filter receives a first reference voltage to charge the capacitance unit through a path formed by the pull-up resistor to the capacitance unit, receives a second reference voltage to discharge the capacitance unit through a path formed by the pull-down resistor to the capacitance unit and outputs a control voltage generated based on a charge amount of the charged capacitance unit. The first reference voltage is provided when the first control signal is inputted to the loop filter from the phase-frequency detector, the second reference voltage is provided when the second control signal is inputted to the loop filter from the phase-frequency detector, and the second reference voltage is less than the first reference voltage.

The loop filter can further include a pull-up switch and a pull-down switch. The pull-up switch can be configured to be turned on based on the first control signal to provide the first reference voltage to the path formed by the pull-up resistor to the capacitance unit to charge the capacitance unit. The pull-down switch can be configured to be turned on based on the second control signal to provide the second reference voltage to the path formed by the pull-down resistor to the capacitance unit to discharge the capacitance unit.

A resistance of the pull-up resistor can be higher than an impedance of a parasitic capacitance of the pull-up switch, and a resistance of the pull-down resistor can be higher than an impedance of a parasitic capacitance of the pull-down switch.

The loop filter can be configured to receive the first and the second reference voltages to cause a current flowing through a path formed by the pull-up resistor and the pull-down resistor to decrease power consumption when the first and the second control signals are inputted to the loop filter.

The pull-up switch can include a pull-up p-channel metal oxide semiconductor (PMOS) transistor and a pull-up n-channel metal oxide semiconductor (NMOS) transistor. The pull-up PMOS transistor can be configured to be turned on based on a first inverted control signal that is an inverted signal of the first control signal. The pull-up NMOS transistor can have a drain coupled to a source of the pull-up PMOS transistor and a source coupled to a drain of the pull-up PMOS transistor, and can be configured to be turned on based on the first control signal.

The pull-down switch can include a pull-down NMOS transistor and a pull-down PMOS transistor. The pull-down NMOS transistor can be configured to be turned on based on the second control signal. The pull-down PMOS transistor can have a source coupled to a drain of the pull-down NMOS transistor and a drain coupled to a source of the pull-down NMOS transistor, and can be configured to be turned on based on a second inverted control signal that is an inverted signal of the second control signal.

The pull-down switch can further include a NMOS transistor and a PMOS transistor. The NMOS transistor can be configured to be turned on based on a third reference voltage. The PMOS transistor can have a source coupled to a drain of the NMOS transistor and a drain coupled to a source of the NMOS transistor, and can be configured to be turned on based on a fourth reference voltage that is less than the third reference voltage. The second control signal can be provided to the source of the NMOS transistor and the drain of the PMOS transistor, the provided second control signal can be outputted from the drain of the NMOS transistor and the source of the PMOS transistor, and the outputted second control signal can be provided to a gate of the pull-down NMOS transistor.

The capacitance unit can include a main capacitor, a ripple prevention resistor and a ripple prevention capacitor. The ripple prevention resistor can be coupled in series to the main capacitor. The ripple prevention capacitor can be coupled in parallel to the main capacitor.

The phase locked loop can further include a voltage-controlled oscillator (VCO). The VCO can be configured to output an oscillating signal based on the control voltage.

The phase locked loop can further include a divider. The divider can be configured to divide the oscillating signal by a division ratio N, where N is a natural number, and to provide the divided oscillating signal to the phase-frequency detector as the feedback signal.

In accordance with another aspect of the present invention, an integrated circuit includes a phase locked loop. The phase locked loop includes a phase-frequency detector and a loop filter. The phase-frequency detector is configured to compare phases of an input signal and a feedback signal to generate first and second control signals. The loop filter includes a pull-up resistor, a pull-down resistor and a capacitance unit. The capacitance unit is coupled to a coupling node between the pull-up resistor and the pull-down resistor. The loop filter receives a first reference voltage to charge the capacitance unit through a path formed by the pull-up resistor to the capacitance unit, receives a second reference voltage to discharge the capacitance unit through a path formed by the pull-down resistor to the capacitance unit, and outputs a control voltage generated based on a charge amount of the charged capacitance unit The first reference voltage is provided when the first control signal is inputted to the loop filter from the phase-frequency detector. The second reference voltage is provided when the second control signal is inputted to the loop filter from the phase-frequency detector. The second reference voltage is less than the first reference voltage.

The loop filter can further include a pull-up switch and a pull-down switch. The pull-up switch can be configured to be turned on based on the first control signal to provide the first reference voltage to the path formed by the pull-up resistor to the capacitance unit to charge the capacitance unit. The pull-down switch can be configured to be turned on based on the second control signal to provide the second reference voltage to the path formed by the pull-down resistor to the capacitance unit to discharge the capacitance unit.

A resistance of the pull-up resistor can be higher than an impedance of a parasitic capacitance of the pull-up switch, and a resistance of the pull-down resistor can be higher than an impedance of a parasitic capacitance of the pull-down switch.

The loop filter can be configured to receive the first and the second reference voltages to cause a current through a path formed by the pull-up resistor and the pull-down resistor to decrease power consumption when the first and the second control signals are inputted to the loop filter.

The pull-up switch can include a pull-up p-channel metal oxide semiconductor (PMOS) transistor and a pull-up n-channel metal oxide semiconductor (NMOS) transistor. The pull-up PMOS can be configured to be turned on based on a first inverted control signal that is an inverted signal of the first control signal. The pull-up NMOS transistor can have a drain coupled to a source of the pull-up PMOS transistor and a source coupled to a drain of the pull-up PMOS transistor, and can be configured to be turned on based on the first control signal.

The pull-down switch can include a pull-down NMOS transistor and a pull-down PMOS transistor. The pull-down NMOS transistor can be configured to be turned on based on the second control signal. The pull-down PMOS transistor can have a source coupled to a drain of the pull-down NMOS transistor and a drain coupled to a source of the pull-down NMOS transistor, and can be configured to be turned on based on a second inverted control signal that is an inverted signal of the second control signal.

The pull-down switch can further include a NMOS transistor and a PMOS transistor. The NMOS transistor can be configured to be turned on based on a third reference voltage. The PMOS transistor can have a source coupled to a drain of the NMOS transistor and a drain coupled to a source of the NMOS transistor, and can be configured to be turned on based on a fourth reference voltage that is less than the third reference voltage. The second control signal can be provided to the source of the NMOS transistor and the drain of the PMOS transistor, the provided second control signal can be outputted from the drain of the NMOS transistor and the source of the PMOS transistor, and the outputted second control signal can be provided to a gate of the pull-down NMOS transistor.

The capacitance unit can include a main capacitor, a ripple prevention resistor and a ripple prevention capacitor. The ripple prevention resistor can be coupled in series to the main capacitor. The ripple prevention capacitor can be coupled in parallel to the main capacitor.

The phase-locked loop can further include a voltage-controlled oscillator (VCO). The VCO can be configured to output an oscillating signal based on the control voltage.

The phase-locked loop can further include a divider. The divider can be configured to divide the oscillating signal by a division ratio N, where N is a natural number, and to provide the divided oscillating signal to the phase-frequency detector as the feedback signal.

In accordance with another aspect of the present invention, provided is a method of locking a phase. According to the method, a capacitance unit is charged through a path formed by a pull-up resistor coupled to the capacitance unit by receiving a first reference voltage provided when a first control signal is inputted to a loop filter from a phase-frequency detector. The capacitance unit is discharged through a path formed by a pull-down resistor coupled to the capacitance unit by receiving a second reference voltage provided when a second control signal is inputted to the loop filter from the phase-frequency detector. A control voltage generated based on a charge amount of the charged capacitance unit is outputted.

The method can further include causing a current flowing through a path formed by the pull-up resistor and the pull-down resistor by receiving the first and the second reference voltages when the first and the second control signals are inputted to the loop filter.

The method can further include outputting an oscillating signal based on the control voltage.

Therefore, a phase locked loop without a charge pump can operate at a relatively low voltage and can operate based on a control voltage with a wide input range.

DESCRIPTION OF THE EMBODIMENTS

Embodiments in accordance with the present invention now will be described more fully with reference to the accompanying drawings. The invention can, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 2:
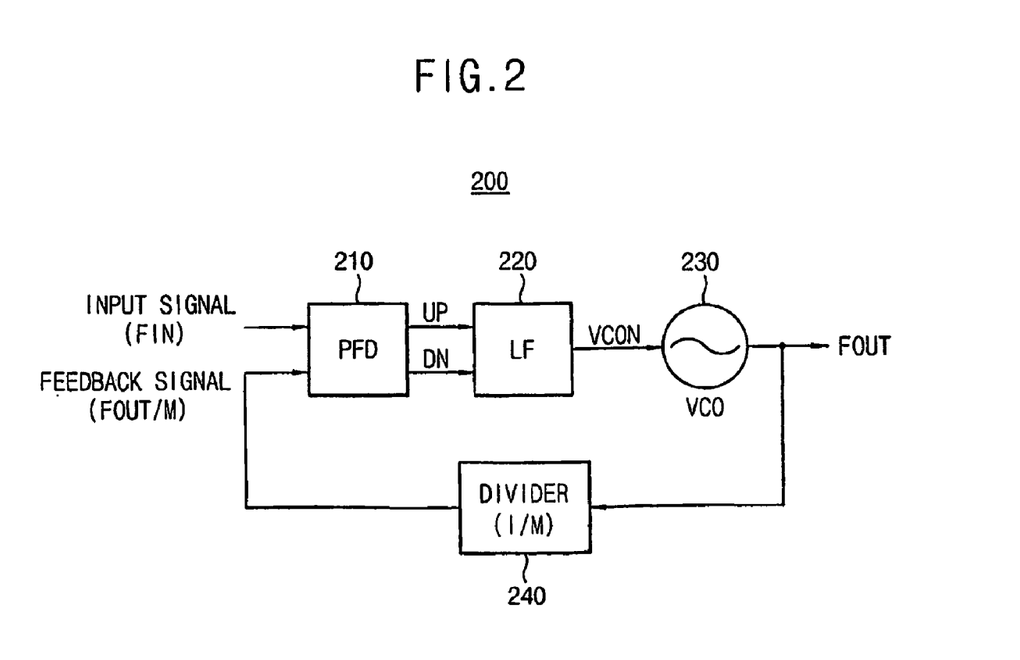
FIG. 2 is a block diagram illustrating an example embodiment of a phase locked loop (PLL) without a charge pump according to an aspect of the present invention.

FIG. 2 is a block diagram illustrating an example embodiment of a phase locked loop without a charge pump according to an aspect of the present invention.

Referring to FIG. 2, a phase locked loop 200 includes a phase-frequency detector 210, a loop filter 220, a voltage-controlled oscillator 230, and a divider 240.

The phase-frequency detector 210 receives an input signal (FIN) and a feedback signal (FOUT/M) and detects a phase/frequency difference between the input signal (FIN) and the feedback signal (FOUT/M). When the phase/frequency difference between the input signal (FIN) and the feedback signal (FOUT/M) exists, the phase-frequency detector 210 generates a first control signal or a second control signal (for example, an UP signal or a DN signal).

For example, when the input signal (FIN) follows the feedback signal (FOUT/M), the phase-frequency detector 210 can generate the first control signal (that is, the UP signal), and when the input signal (FIN) precedes the feedback signal (FOUT/M), the phase-frequency detector 210 can generate the second control signal (that is, the DN signal).

The loop filter 220 generates a control voltage VCON based on the first control signal or the second control signal outputted from the phase-frequency detector 210. For example, when the loop filter 220 receives the first control signal, the loop filter 220 can increase the control voltage VCON, and when the loop filter 220 receives the second control signal, the loop filter 220 can decrease the control voltage VCON. A performance of the loop filter 220 is described later herein below.

The voltage-controlled oscillator 230 outputs an oscillating signal (FOUT) based on the control voltage VCON outputted from the loop filter 220. For example, when the control voltage VCON is increased, the voltage-controlled oscillator 230 can output an oscillating signal (FOUT) having a high frequency, and when the control voltage VCON is decreased, the voltage-controlled oscillator 230 can output an oscillating signal (FOUT) having a low frequency.

The divider 240 divides the oscillating signal (FOUT) outputted from the voltage control oscillator 230 by a division ratio M (where M is a natural number) and provides the divided oscillating signal to the phase-frequency detector 210 as the feedback signal (FOUT/M).

Therefore, the phase locked loop 200 according to the example embodiment can be implemented in an integrated circuit and can be implemented without a charge pump.

Figure 3:
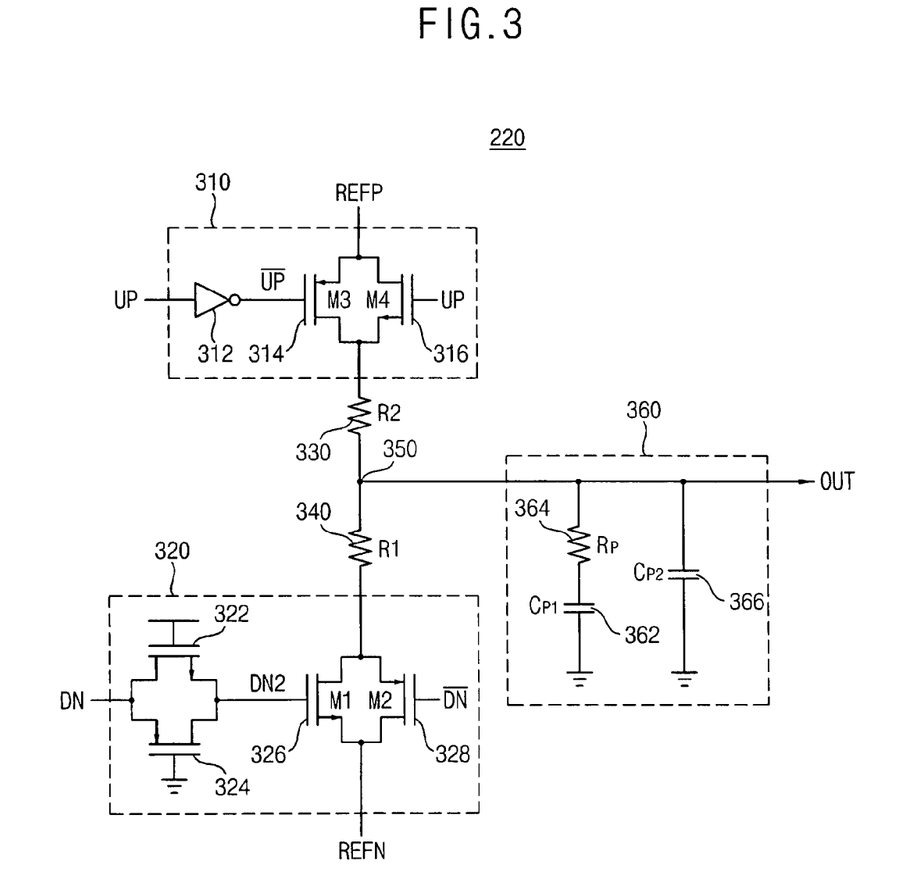
FIG. 3 is a circuit diagram illustrating an embodiment of a loop filter in the PLL of FIG. 2.

FIG. 3 is a circuit diagram illustrating an embodiment of a loop filter that can be used in the PLL 200 of FIG. 2.

Referring to FIG. 3, the loop filter 220 includes a pull-up switch 310, a pull-down switch 320, a pull-up resistor 330, a pull-down resistor 340, a coupling node 350 and a capacitance unit 360.

For example, the pull-down resistor 340 can be coupled to the pull-up resistor 330 at the coupling node 350 and in series, and the capacitance unit 360 can also be coupled to the coupling node 350 between the pull-up resistor 330 and the pull-down resistor 340.

The pull-up switch 310 is turned on based on the first control signal (for example, the UP signal) to provide a first reference voltage REFP (for example, VDD) to a path formed by the pull-up resistor 330 to the capacitance unit 360 to charge the capacitance unit 360.

For example, the pull-up switch 310 can include a pull-up p-channel metal oxide semiconductor (PMOS) transistor 314, and a pull-up n-channel metal oxide semiconductor (NMOS) transistor 316 having a drain coupled to a source of the pull-up PMOS transistor 314 and a source coupled to a drain of the pull-up PMOS transistor 314. The pull-up PMOS transistor 314 is turned on based on a first inverted control signal that is an inverted signal of the first control signal and the pull-up NMOS transistor 316 is turned on based on the first control signal.

The pull-down switch 320 is turned on based on the second control signal (for example, the DN signal) to provide a second reference voltage REFN (for example, VGND) to a path formed by the pull-down resistor 340 to the capacitance unit 360 to charge the capacitance unit 360.

For example, the pull-down switch 320 can include a pull-down NMOS transistor 326 and a pull-down PMOS transistor 328 having a source coupled to a drain of the pull-down NMOS transistor 326 and a drain coupled to a source of the pull-down NMOS transistor 326. The pull-down NMOS transistor 326 is turned on based on the second control signal, and the pull-down PMOS transistor 328 is turned on based on a second inverted control signal that is an inverted signal of the second control signal.

Also, the pull-down switch 320 can further include an NMOS transistor 322 and a PMOS transistor 324 having a source coupled to a drain of the NMOS transistor 322 and a drain coupled to a source of the NMOS transistor 322. The NMOS transistor 322 is turned on based on a third reference voltage (for example, VDD) and the PMOS transistor 324 is turned on based on a fourth reference voltage (for example, VGND) that is less than the third reference voltage.

A resistance of the pull-up resistor 330 is higher than an impedance of a parasitic capacitance of the pull-up switch 310, and a resistance of the pull-down resistor 340 is higher than an impedance of a parasitic capacitance of the pull-down switch 320. Therefore, when the pull-up switch 310 and the pull-down switch 320 are turned on, power consumption can be decreased by the pull-up resistor 330 and the pull-down resistor 340.

The capacitance unit 360 is charged or discharged based on the first control signal or the second control signal outputted from the phase-frequency detector 210, and the capacitance unit 360 generates the control voltage VCON according to an amount of a charge thereof.

For example, the capacitance unit 360 can include a main capacitor 362, a ripple prevention resistor 364 coupled to the main capacitor 362 in series and a ripple prevention capacitor 366 coupled to the main capacitor 362 in parallel.

Figure 4:
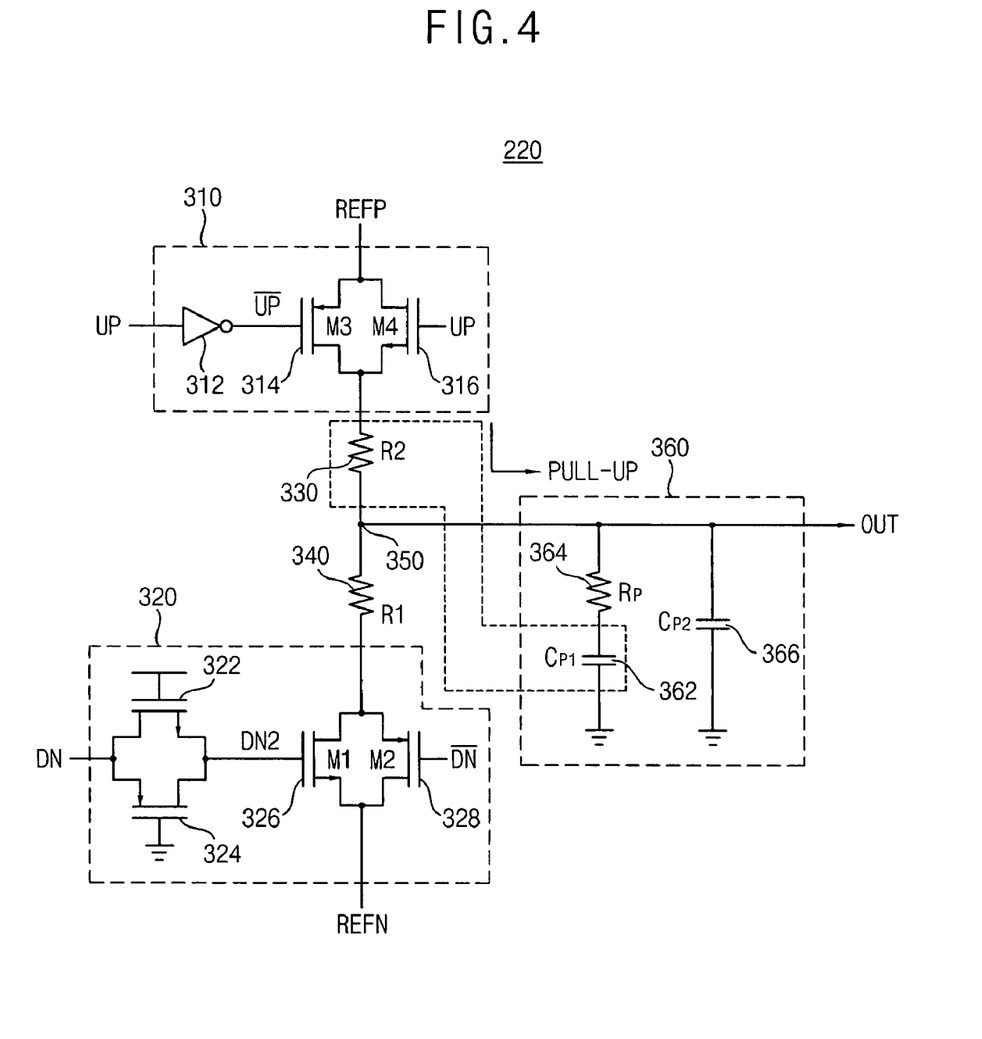
FIG. 4 is a diagram for describing an embodiment of a process of increasing the control voltage by charging the capacitance unit in the loop filter.
Figure 5:
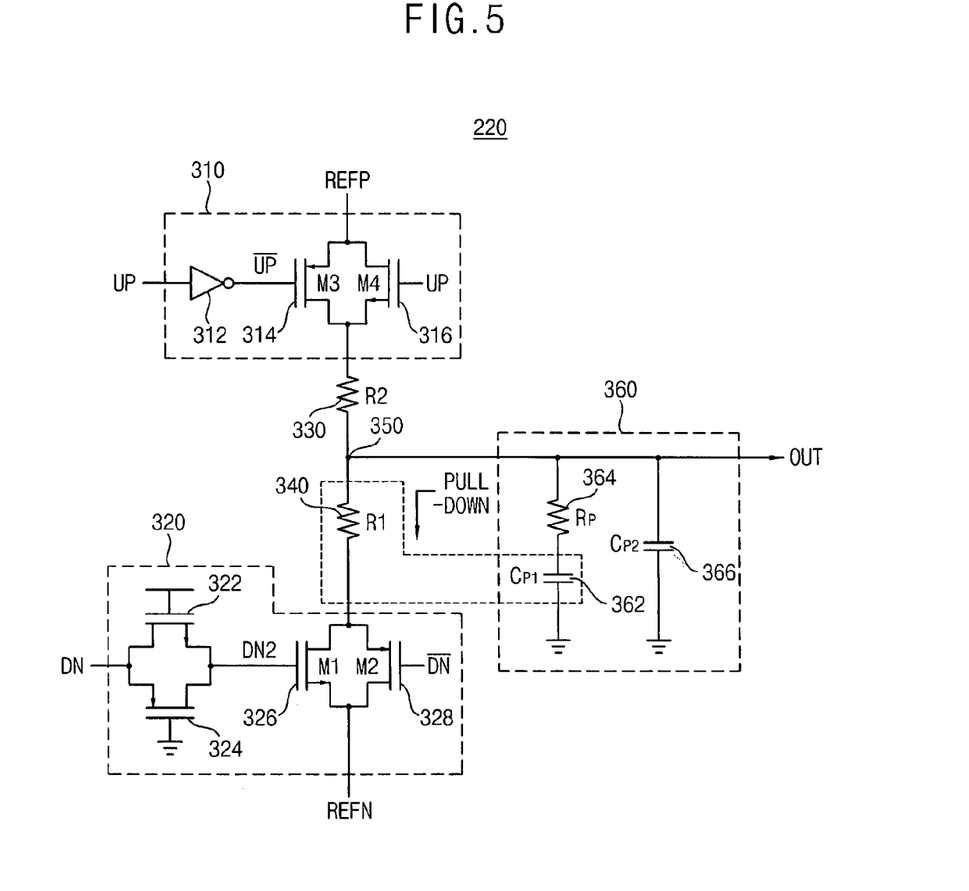
FIG. 5 is a diagram for describing an embodiment of a process of decreasing the control voltage by discharging the capacitance unit in the loop filter.
Figure 6:
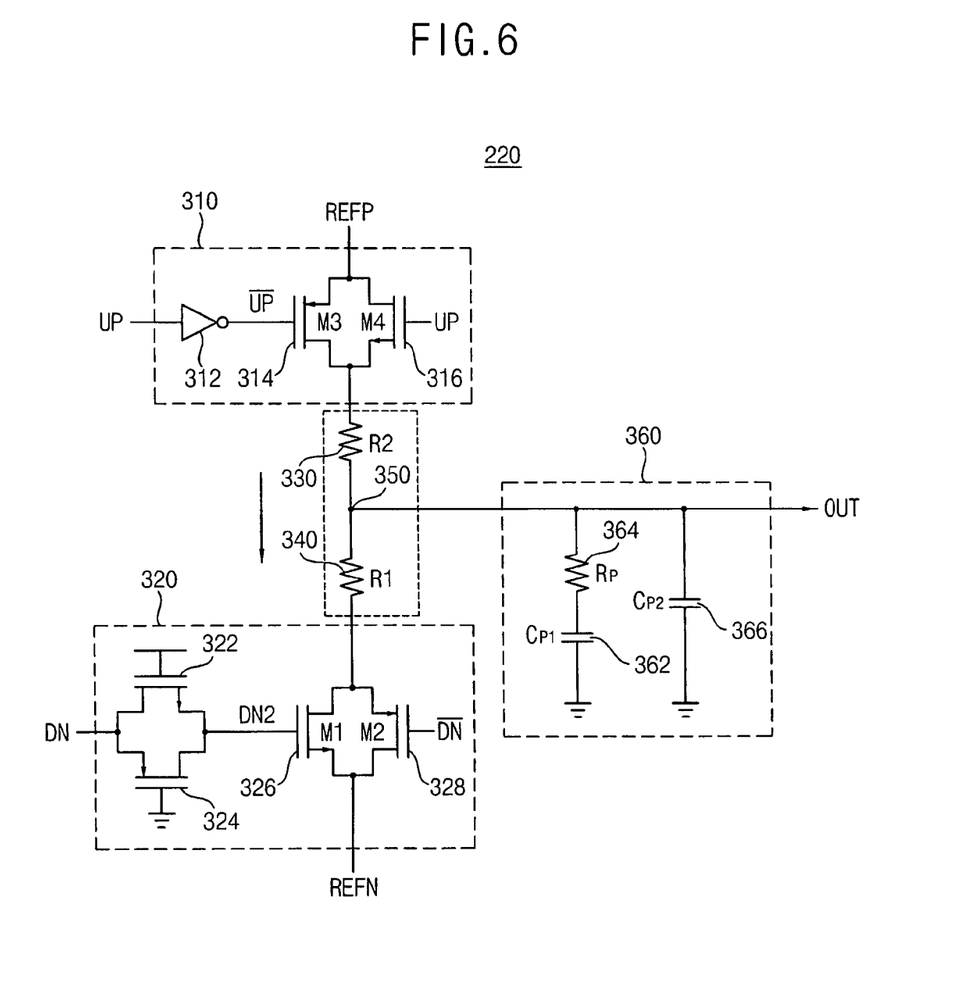
FIG. 6 is a diagram for describing an embodiment of a process of decreasing power consumption of the loop filter.

FIG. 4 is a diagram for describing an embodiment of a process of increasing the control voltage by charging the capacitance unit in the loop filter, FIG. 5 is a diagram for describing an embodiment of a process of decreasing the control voltage by discharging the capacitance unit in the loop filter and FIG. 6 is a diagram for describing an embodiment of a process of decreasing power consumption of the loop filter.

Referring to FIG. 4, the loop filter 220 receives the first reference voltage REFP provided when the first control signal is inputted to the loop filter 220 from the phase-frequency detector 210 to charge the capacitance unit 360 through the path formed by the pull-up resistor 330 to the capacitance unit 360.

For example, when the first control signal is inputted to the loop filter 220, the loop filter can form a first order RC integration circuit including the pull-up resistor 330 and the capacitance unit 360.

Referring to FIG. 5, the loop filter 220 receives the second reference voltage REFN provided when the first control signal is inputted to the loop filter 220 from the phase-frequency detector 210 to charge the capacitance unit 360 through the path formed by the pull-down resistor 340 to the capacitance unit 360. The second reference voltage REFN is less than the first reference voltage REFP.

For example, when the second control signal is inputted to the loop filter 220, the loop filter can form a first order RC integration circuit including the pull-down resistor 340 and the capacitance unit 360.

Referring to FIG. 6, when the first and the second control signals are inputted to the loop filter 220, the loop filter receives the first and the reference voltages REFP and REFN to cause a current flowing through a path formed by the pull-up resistor 330 and the pull-down resistor 340, indicated with an arrow. Therefore, power consumption can be decreased.

For example, when the first and the second control signals are inputted to the loop filter 220, the loop filter 220 can form a series resistor circuit including the pull-up resistor 330 and the pull-down resistor 340.

Figure 7:
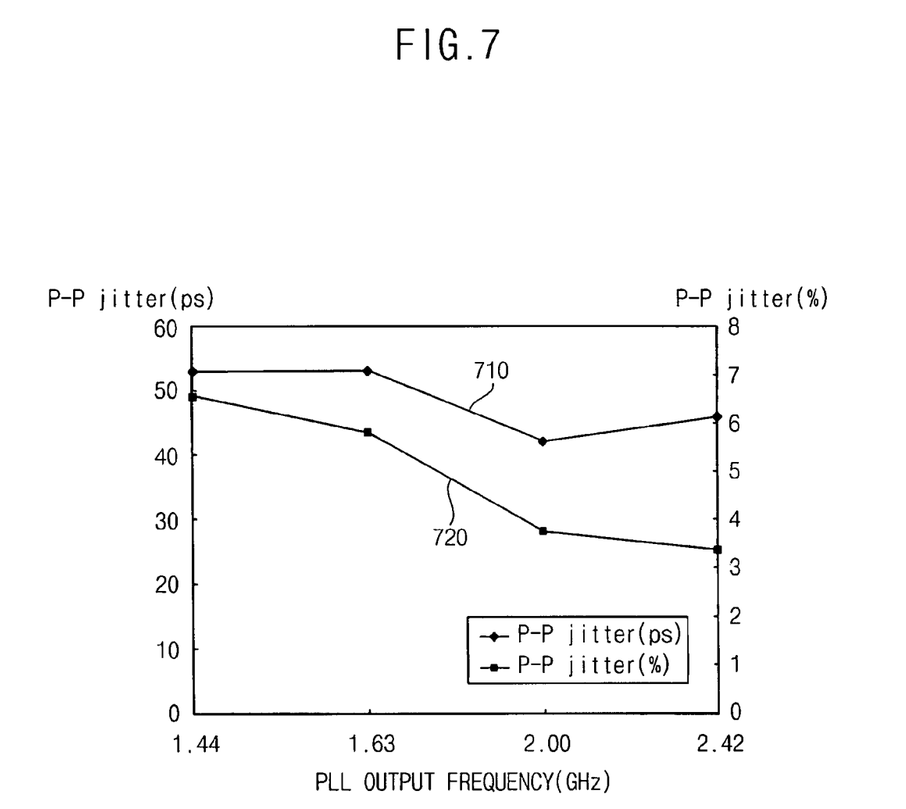
FIG. 7 is a graph illustrating a performance of an example embodiment of a PLL according to an aspect of the present invention.

FIG. 7 is a graph illustrating a performance of an example embodiment of a phase locked loop according to an aspect of the present invention.

Referring to FIG. 7, a line 710 illustrates an absolute value of a peak-to-peak jitter and a line 720 illustrates a relative value indicating a ratio of a peak-to-peak jitter and a period.

As illustrated in FIG. 7, although the phase locked loop 200 does not include a charge pump, the phase locked loop 200 efficiently operates by implementing the loop filter 220 with the pull-up resistor 330 and the pull-down resistor 340.

As described above, a phase locked loop without a charge pump can operate at a relatively low voltage and can operate based on a control voltage with a wide input range.

Having thus described example embodiments in accordance with aspects of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A phase locked loop; comprising:
   a phase-frequency detector configured to compare phases of an input signal and a feedback signal to generate first and second control signals; and
   a loop filter including a pull-up resistor, a pull-down resistor and a capacitance unit, the capacitance unit being coupled to a coupling node between the pull-up resistor and the pull-down resistor, the loop filter configured to receive a first reference voltage to charge the capacitance unit through a path formed by the pull-up resistor to the capacitance unit, configured to receive a second reference voltage to discharge the capacitance unit through a path formed by the pull-down resistor to the capacitance unit, and configured to output a control voltage generated based on a charge amount of the charged capacitance unit, the first reference voltage being provided when the first control signal is inputted to the loop filter from the phase-frequency detector, the second reference voltage being provided when the second control signal is inputted to the loop filter from the phase-frequency detector, the second reference voltage being less than the first reference voltage,
   wherein the loop filter further comprises:
      a pull-up switch configured to be turned on based on the first control signal to provide the first reference voltage to the path formed by the pull-up resistor to the capacitance unit to charge the capacitance unit; and
      a pull-down switch configured to be turned on based on the second control signal to provide the second reference voltage to the path formed by the pull-down resistor to the capacitance unit to discharge the capacitance unit, and wherein the pull-up switch comprises;
a pull-up p-channel metal oxide semiconductor (PMOS) transistor configured to be turned on based on a first inverted control signal that is an inverted signal of the first control signal; and
a pull-up n-channel metal oxide semiconductor (NMOS) transistor having a drain coupled to a source of the pull-up PMOS transistor and a source coupled to a drain of the pull-up PMOS transistor, and configured to be turned on based on the first control signal.

2. The phase locked loop of claim 1, wherein a resistance of the pull-up resistor is higher than an impedance of a parasitic capacitance of the pull-up switch, and a resistance of the pull-down resistor is higher than an impedance of a parasitic capacitance of the pull-down switch.

3. The phase locked loop of claim 1, wherein the capacitance unit comprises:
a main capacitor;
a ripple prevention resistor coupled in series to the main capacitor; and
a ripple prevention capacitor coupled in parallel to the main capacitor.

4. The phase locked loop of claim 1, further comprising:
a voltage-controlled oscillator (VCO) configured to output an oscillating signal based on the control voltage.

5. The phase locked loop of claim 4, further comprising:
a divider configured to divide the oscillating signal by a division ratio N, where N is a natural number, and to provide the divided oscillating signal to the phase-frequency detector as the feedback signal.

6. A phase locked loop, comprising:
a phase-frequency detector configured to compare phases of an input signal and a feedback signal to generate first and second control signals; and
a loop filter including a pull-up resistor, a pull-down resistor and a capacitance unit, the capacitance unit being coupled to a coupling node between the pull-up resistor and the pull-down resistor, the loop filter configured to receive a first reference voltage to charge the capacitance unit through a path formed by the pull-up resistor to the capacitance unit, configured to receive a second reference voltage to discharge the capacitance unit through a path formed by the pull-down resistor to the capacitance unit, and configured to output a control voltage generated based on a charge amount of the charged capacitance unit, the first reference voltage being provided when the first control signal is inputted to the loop filter from the phase-frequency detector, the second reference voltage being provided when the second control signal is inputted to the loon filter from the phase-frequency detector, the second reference voltage being less than the first reference voltage,
wherein the loop filter further comprises:
a pull-up switch configured to be turned on based on the first control signal to provide the first reference voltage to the path formed by the pull-up resistor to the capacitance unit to charge the capacitance unit; and
a pull-down switch configured to be turned on based on the second control signal to provide the second reference voltage to the path formed by the pull-down resistor to the capacitance unit to discharge the capacitance unit, and
wherein the pull-down switch comprises:

a pull-down NMOS transistor configured to be turned on based on the second control signal; and
a pull-down PMOS transistor having a source coupled to a drain of the pull-down NMOS transistor and a drain coupled to a source of the pull-down NMOS transistor, and configured to be turned on based on a second inverted control signal that is an inverted signal of the second control signal.

7. The phase locked loop of claim 6, wherein the pull-down switch further comprises:
a NMOS transistor configured to be turned on based on a third reference voltage; and
a PMOS transistor having a source coupled to a drain of the NMOS transistor and a drain coupled to a source of the NMOS transistor, and configured to be turned on based on a fourth reference voltage that is less than the third reference voltage, and
wherein the second control signal is provided to the drain of the NMOS transistor and the source of the PMOS transistor, the provided second control signal is outputted from the source of the NMOS transistor and the drain of the PMOS transistor, and the outputted second control signal is provided to a gate of the pull-down NMOS transistor.

8. An integrated circuit comprising a phase locked loop, the phase locked loop comprising:
a phase-frequency detector configured to compare phases of an input signal and a feedback signal to generate first and second control signals; and
a loop filter including a pull-up resistor, a pull-down resistor and a capacitance unit, the capacitance unit being coupled to a coupling node between the pull-up resistor and the pull-down resistor, the loop filter configured to receive a first reference voltage to charge the capacitance unit through a path formed by the pull-up resistor to the capacitance unit, configured to receive a second reference voltage to discharge the capacitance unit through a path formed by the pull-down resistor to the capacitance unit, and configured to output a control voltage generated based on a charge amount of the charged capacitance unit, the first reference voltage being provided when the first control signal is inputted to the loop filter from the phase-frequency detector, the second reference voltage being provided when the second control signal is inputted to the loop filter from the phase-frequency detector, the second reference voltage being less than the first reference voltage,
wherein the loop filter further comprises:
a pull-up switch configured to be turned on based on the first control signal to provide the first reference voltage to the path formed by the pull-up resistor to the capacitance unit to charge the capacitance unit; and
a pull-down switch configured to be turned on based on the second control signal to provide the second reference voltage to the path formed by the pull-down resistor to the capacitance unit to discharge the capacitance unit, and wherein the pull-up switch comprises:
a pull-up p-channel metal oxide semiconductor (PMOS) transistor configured to be turned on based on a first inverted control signal that is an inverted signal of the first control signal; and
a pull-up n-channel metal oxide semiconductor (NMOS) transistor having a drain coupled to a source of the pull-up PMOS transistor and a source coupled to a drain of the pull-up PMOS transistor and a source coupled to a drain of the pull-up PMOS transistor, and configured to be turned on based on the first control signal.

9. The integrated circuit of claim 8, wherein a resistance of the pull-up resistor is higher than an impedance of a parasitic capacitance of the pull-up switch, and a resistance of the pull-down resistor is higher than an impedance of a parasitic capacitance of the pull-down switch.

10. The integrated circuit of claim 8, wherein the capacitance unit comprises:
   a main capacitor;
   a ripple prevention resistor coupled in series to the main capacitor; and
   a ripple prevention capacitor coupled in parallel to the main capacitor.

11. The integrated circuit of claim 8, wherein the phase locked loop further comprises:
   a voltage-controlled oscillator (VCO) configured to output an oscillating signal based on the control voltage.

12. The integrated circuit of claim 11, wherein the phase locked loop further comprises:
   a divider configured to divide the oscillating signal by a division ratio N, where N is a natural number, and to provide the divided oscillating signal to the phase-frequency detector as the feedback signal.

13. A integrated circuit comprising a phase locked loop, the phase locked loop comprising:
   a phase-frequency detector configured to compare phases of an input signal and a feedback signal to generate first and second control signals; and
   a loop filter including a pull-up resistor, a pull-down resistor and a capacitance unit, the capacitance unit being coupled to a coupling node between the pull-up resistor and the pull-down resistor, the loop filter configured to receive a first reference voltage to charge the capacitance unit through a path formed by the pull-up resistor to the capacitance unit, configured to receive a second reference voltage to discharge the capacitance unit through a path formed by the pull-down resistor to the capacitance unit, and configured to output a control voltage generated based on a charge amount of the charged capacitance unit, the first reference voltage being provided when the first control signal is inputted to the loop filter from the phase-frequency detector, the second reference voltage being provided when the second control signal is inputted to the loop filter from the phase-frequency detector, the second reference voltage being less than the first reference voltage,
   wherein the loon filter further comprises:
      a pull-up switch configured to be turned on based on the first control signal to provide the first reference voltage to the path formed by the pull-up resistor to the capacitance unit to charge the capacitance unit; and
      a pull-down switch configured to be turned on based on the second control signal to provide the second reference voltage to the path formed by the pull-down resistor to the capacitance unit to discharge the capacitance unit, and
   wherein the pull-down switch comprises:
      a pull-down NMOS transistor configured to be turned on based on the second control signal; and
      a pull-down PMOS transistor having a source coupled to a drain of the pull-down NMOS transistor and a drain coupled to a source of the pull-down NMOS transistor, and configured to be turned on based on a second inverted control signal that is an inverted signal of the second control signal.

14. The integrated circuit of claim 13, wherein the pull-down switch further comprises:
   a NMOS transistor configured to be turned on based on a third reference voltage; and
   a PMOS transistor having a source coupled to a drain of the NMOS transistor and a drain coupled to a source of the NMOS transistor, and configured to be turned on based on a fourth reference voltage that is less than the third reference voltage, and
   wherein the second control signal is provided to the drain of the NMOS transistor and the source of the PMOS transistor, the provided second control signal is outputted from the source of the NMOS transistor and the drain of the PMOS transistor, and the outputted second control signal is provided to a gate of the pull-down NMOS transistor.

* * * * *